United States Patent [19]

Mahant-Shetti et al.

[11] Patent Number: 5,398,198
[45] Date of Patent: Mar. 14, 1995

[54] SINGLE INTEGRATED CIRCUIT HAVING BOTH A MEMORY ARRAY AND AN ARITHMETIC AND LOGIC UNIT (ALU)

[75] Inventors: Shivaling S. Mahant-Shetti, Richardson, Tex.; Shobana Swamy, Los Angeles, Calif.

[73] Assignee: Texas Instruments Incorporated, Dallas, Tex.

[21] Appl. No.: 260,494

[22] Filed: Jun. 14, 1994

Related U.S. Application Data

[63] Continuation of Ser. No. 559,483, Jul. 30, 1990, abandoned.

[51] Int. Cl.⁶ ............................................. G06F 7/38
[52] U.S. Cl. .................................. 364/716; 365/51; 365/63; 326/39; 326/41
[58] Field of Search ................. 364/716, 784, 786; 395/24, 27; 365/51, 63, 154, 167, 189.08, 189.11, 190, 230.05; 307/445, 448, 451, 465, 465.1, 468, 469, 303.1, 303.2; 340/825.79, 825.86, 825.87, 825.91

[56] References Cited

U.S. PATENT DOCUMENTS

| | | | |
|---|---|---|---|
| 4,068,214 | 1/1978 | Patil | 364/716 |
| 4,293,783 | 10/1981 | Patil | 364/716 |
| 4,508,977 | 4/1985 | Page et al. | 307/468 |
| 4,525,809 | 6/1985 | Chiba et al. | 365/51 |
| 4,546,273 | 10/1985 | Osman | 307/468 |
| 4,876,466 | 10/1989 | Kondou et al. | 307/465 |
| 4,912,665 | 3/1990 | Waller et al. | 364/716 |
| 4,924,440 | 5/1990 | Tanoi | 365/189.08 |
| 4,972,105 | 11/1990 | Burton et al. | 307/468 |
| 5,053,993 | 10/1991 | Miura | 365/104 |
| 5,063,537 | 11/1991 | Akrout et al. | 365/96 |

FOREIGN PATENT DOCUMENTS

2105938 3/1983 United Kingdom .

*Primary Examiner*—Jack B. Harvey
*Assistant Examiner*—Jack A. Lane
*Attorney, Agent, or Firm*—Peter Rutkowski; Richard Donaldson; William E. Hiller

[57] ABSTRACT

An arithmetic and logic unit implemented in a memory array. The memory array has a plurality of memory cells each with a memory storage element and each accessible via a word line and at least one bit line, The arithmetic and logic unit comprises a plurality of logic circuits coupled to the word and bit lines in place of the memory storage elements of certain memory cells. Each of a plurality of pull down logic circuits implements an arithmetic and/or logic function,

4 Claims, 3 Drawing Sheets

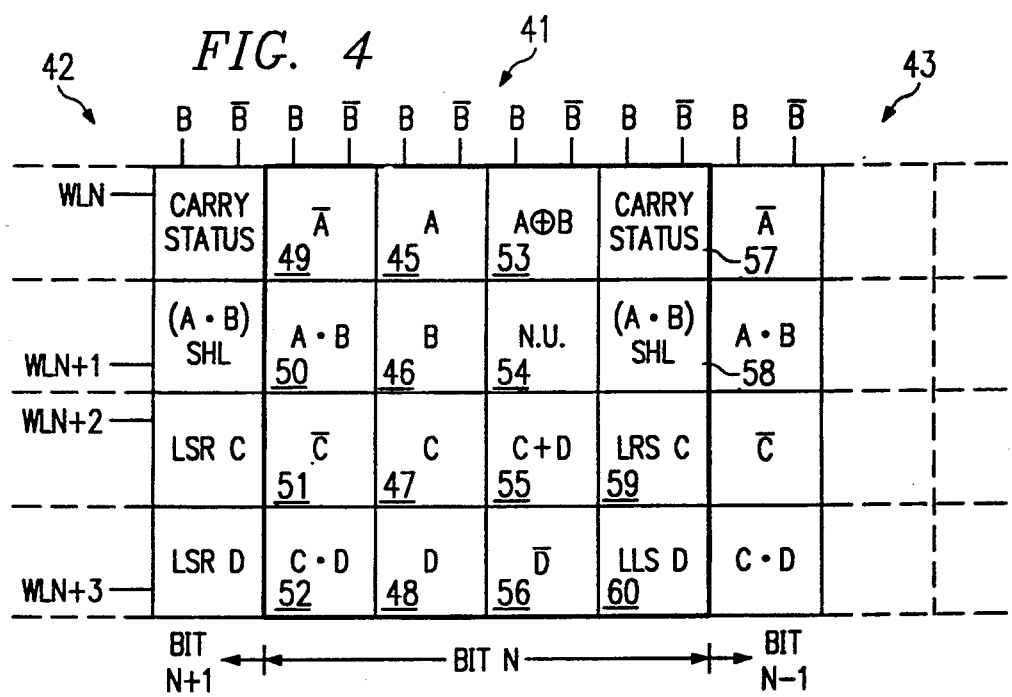

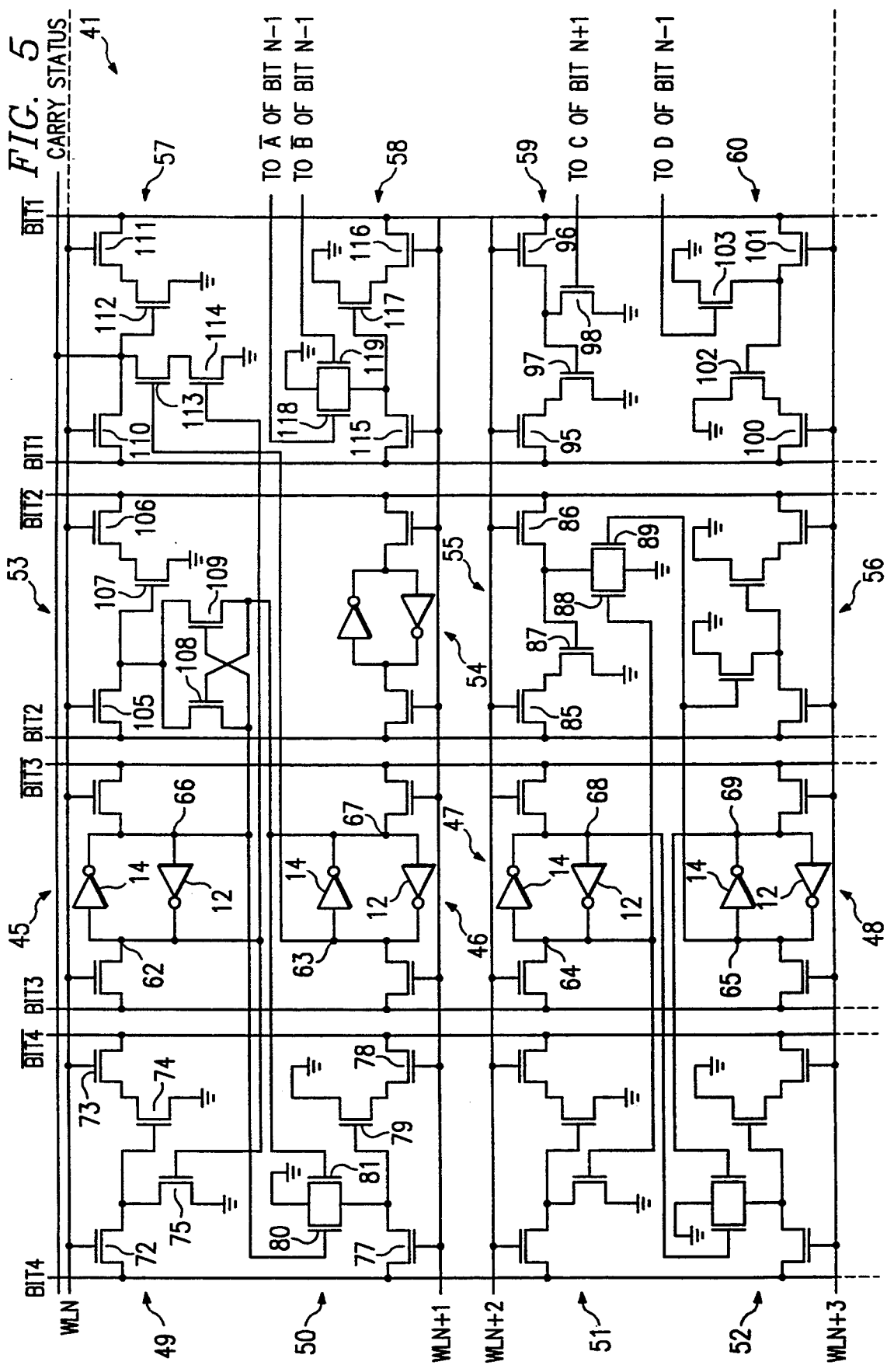

SINGLE INTEGRATED CIRCUIT HAVING BOTH A MEMORY ARRAY AND AN ARITHMETIC AND LOGIC UNIT (ALU)

This application is a continuation of application Ser. No. 07/559,483, filed on Jul. 30, 1990, now abandoned, entitled A SINGLE INTEGRATED CIRCUIT HAVING BOTH A MEMORY ARRAY AND AN ALU.

TECHNICAL FIELD OF THE INVENTION

This invention relates in general to the field of logic circuits, and more particularly to arithmetic and logic units.

BACKGROUND OF THE INVENTION

Arithmetic and logic units (ALUs), which are an integral part of processing units, have traditionally been implemented with adders, registers and combinational logic circuits. Efforts to achieve speed or compactness in these ALUs have brought forth parallel architectures and implementation in dynamic MOS (metal oxide semiconductor) and dynamic CMOS (complementary MOS) techniques.

Nevertheless, the insatiable demand for faster or more compact ALU designs is fueled by more demanding computations and applications. Therefore, a desire has arisen for an ALU design which exploits parallel architectures, compact and rectangular layouts, and more compact MOS technologies.

It is further desirable to arrive at an ALU design that will permit multiple processing units functioning in parallel to be accommodated on one integrated circuit (IC) device along with sufficient memory capacity.

The present invention provides for an ALU directed to achieve one or more of the advantages as set forth above.

SUMMARY OF THE INVENTION

In accordance with the present invention, an arithmetic and logic unit is provided which substantially eliminates or reduces disadvantages and problems associated with prior arithmetic and logic units as discussed above.

In one aspect of the present invention, an arithmetic and logic unit implemented in a memory array is provided. The memory has a plurality of memory cells, each with a memory storage element and each accessible via a word line and at least one bit line. The arithmetic and logic unit comprises a plurality of pull down logic circuits coupled to the word and bit lines in place of the memory storage elements of certain memory cells. Each of the plurality of pull down logic circuits implement an arithmetic and/or logic function.

In another aspect of the present invention, apparatus is provided for performing arithmetic and logic functions. The apparatus resides in a plurality of memory cells in a memory array, where the arithmetic and logic functions are executable by writing operands to at least one predetermined memory cell and reading the computed results from another predetermined memory cell.

In yet another aspect of the present invention, a method for performing arithmetic and logic functions using arithmetic and logic function cells residing in a memory array is provided. The method includes the steps of writing at least one operand to a memory cell in the memory array and accessing the memory cell for the operand and providing the operand to at least one arithmetic and logic function cell. A result is then computed and read from the arithmetic and logic function cell.

An important technical advantage of the present invention provides a novel and compact realization of an arithmetic and logic unit.

Another important technical advantage of the present invention provides for the ability to accommodate multiple arithmetic and logic units on one integrated circuit device. Such multiple arithmetic and logic unit implementation may execute in parallel, thus achieving greater computational speed.

BRIEF DESCRIPTION OF THE DRAWINGS

For a better understanding of the present invention, reference may be made to the accompanying drawings, in which:

FIG. 4 is a diagram illustrating the layout of an exemplary function block;

FIG. 5 is a schematic diagram of the exemplary function block; and

FIG. 6 is a block diagram of a memory device having multiple arithmetic and logic units.

DETAILED DESCRIPTION OF THE INVENTION

Figure 1:
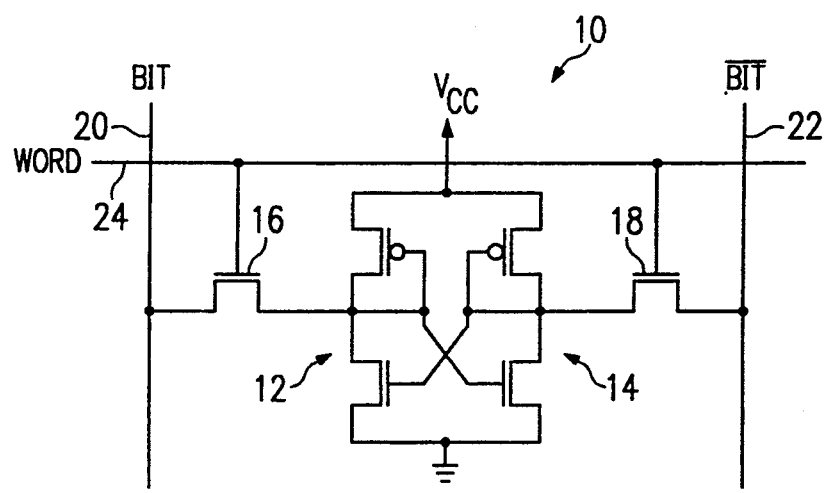
FIG. 1 is a schematic diagram of a prior art static MOS RAM memory cell.

The design of memory integrated circuit devices traditionally exhibits desirable features of regularity, compactness and full utilization of silicon surface. Referring to FIG. 1, a MOS memory cell 10 of the SRAM (static random access memory) type is shown. Memory cell 10 consists of a first CMOS (complementary MOS) inverter 12 coupled to a second CMOS inverter 14 in a flip-flop manner. Inverter 12 is further coupled to a MOS pass transistor 16, and inverter 14 is similarly coupled to a MOS pass transistor 18. Transistors 16 and 18 are coupled to BIT, $\overline{\text{BIT}}$ lines 20 and 22, respectively, and further to a WORD line 24. The details of the structure and operation of SRAM and SRAM memory cell will not be discussed herein as such devices are conventional and are known in the art.

Figure 2:
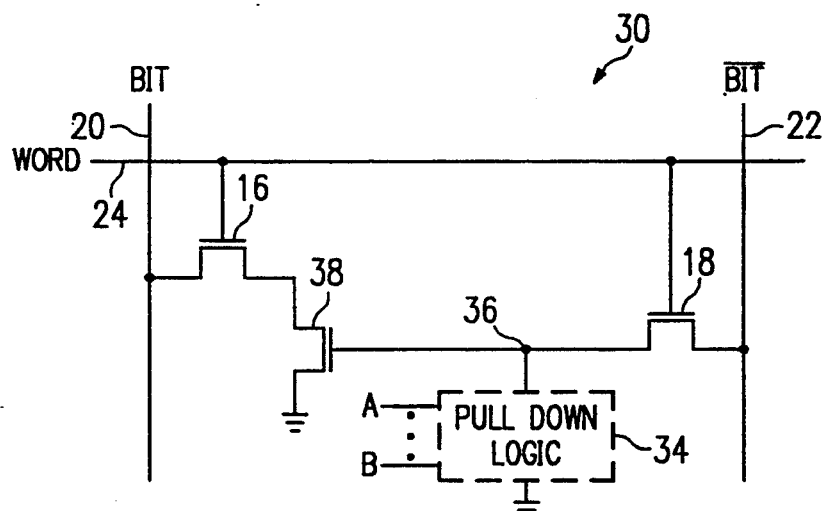
FIG. 2 is a general schematic diagram of an arithmetic and logic function cell.

Using the frame work of an SRAM memory array, certain inverters 12 and 14 of memory cells 10 may be replaced by logic which performs arithmetic and/or logic functions. For example, FIG. 2 shows the general basic block for implementing arithmetic and/or logic functions in a memory cell 30, where like numerals refer to like elements in FIG. 1. Instead of inverters 12 and 14, a pull down logic circuit 34 coupled to ground or a negative supply voltage is coupled to the drain of MOS pass transistor 16. Pull down logic circuit 34 is supplied one or more operands A to B which participate in the arithmetic or logic operation. A common connection node 36 of the drain of transistor 16 and pull down logic circuit 34 are additionally coupled to the gate of a MOS transistor 38, the drain of which is connected to ground as shown in FIG. 2.

In operation, when memory cell 30 of FIG. 2 is selected by appropriate logic values on WORD line 24 and BIT and $\overline{\text{BIT}}$ lines 20 and 22, depending on the logic levels of operands A to B, pull down logic circuit 34 may pull node 36 to a low logic level, which is passed by MOS pass transistor 18 to $\overline{\text{BIT}}$ line 22. At the same time, the low logic level at node 36 keeps transistor 38 turned off, which causes a substantially high or floating voltage level at BIT line 20.

On the other hand, the logic levels of operands A to B may not cause pull down logic circuit 34 to provide a path from ground to node 36. Node 36 remains high, which turns transistor 38 on and causes pass transistor 16 to pull BIT line 20 low and causes $\overline{\text{BIT}}$ line 22 to go high.

Figure 3:
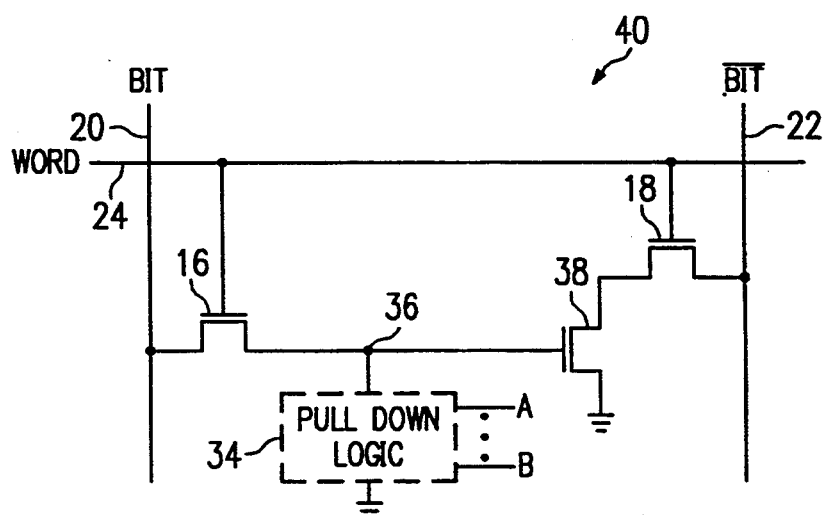
FIG. 3 is a general schematic diagram of another arithmetic and logic function cell.

Referring to FIG. 3, a memory cell 40 implementing inverted logic is shown. Upon inspection thereof, it will be seen that pull down logic circuit 34 and MOS transistor 38 are rearranged and coupled to pass transistors 16 and 18 in a different manner. Node 36 of pull down logic circuit 34 is coupled to the drain of pass transistor 16, the source of which is coupled to BIT line 20. The gate of MOS transistor 38 is still coupled to node 36 as before, but is now coupled to the drain of pass transistor 18, which is coupled to $\overline{\text{BIT}}$ line 22.

In operation of cell 40, when node 36 is at a high logic level due to the nonconducting path in pull down circuit 34, it causes BIT line 20 to be of high logic level and $\overline{\text{BIT}}$ line 22 to be of low logic level. Similarly, when node 36 is pulled to a low logic level by pull down logic circuit 34, it causes BIT line 20 to be low and $\overline{\text{BIT}}$ line 22 to be high. In effect, the configuration in memory cell 40 produces an inversion of the logic function implemented in pull down logic circuit 34.

It may be seen that pull down logic circuit 34 and transistor 38 act as a switch that either couples BIT line 20 or $\overline{\text{BIT}}$ line 22 to ground. In the preferred embodiment of the present invention, because a pull up logic circuit (not shown) connected to node 36 is not required, substantial space saving is achieved. However, it is foreseeable that the use of a pull up logic circuit may be advantageous in certain applications.

Referring to FIG. 4, an exemplary layout of arithmetic and logic cells 45–60 comprising a portion of an ALU is shown. The exemplary ALU serves the purpose of illustrating how an ALU may be implemented in accordance with the present invention by inserting logic into memory cells in a memory array. Therefore, the arithmetic and logic functions implementable by the present invention are not limited by those shown in FIG. 4. Actual disclosure of those functions not shown and described herein is not necessary since the logic implementation of these functions is conventional and known in the art.

It should be noted that although memory array of the static MOS RAM type is shown and described herein, the present invention is also applicable to other types of memory structures, such as ROM (read-only memory) devices, bipolar SRAMs and biCMOS SRAMs.

The portion of the ALU shown includes a function block 41 and neighboring function blocks 42 and 43, which are selectable by exerting the appropriate logic levels on word lines WLN through WLN+3 and bit lines B and $\overline{\text{B}}$ for bit N, N+1 and N−1. Function block 41 comprises memory cells 45 to 48 and arithmetic and logic cells 49 to 60, which perform arithmetic and logic functions for bit N of the operand(s). Function blocks 42 and 43 comprise memory and arithmetic and logic cells for bit N+1 and N−1 of the operand(s), respectively. Function blocks 41, 42 and 43 may be equivalent in structure and layout. Therefore, for operands of word size M, ALU would include M function blocks where each block operates on one bit of the operand(s).

As shown in FIG. 4, memory cells 45 to 48 possess the function of storing a bit for each operand A, B, C and D. Thus, the construction and operation of memory cells 45 to 48 are like that of memory cell 10 shown in FIG. 1. Arithmetic and logic cell 49 is implemented in the exemplary ALU to produce $\overline{\text{A}}$, or to invert the logic level of bit N of operand A, which is stored in memory cell 45. Cell 50 has been designated to implement the (A AND B) or (A·B) function. Cell 51 inverts the logic level of bit N of operand C. Cell 52 produces the (C AND D) function.

Additional logic functions A XOR B (A exclusive-OR B), C OR D (or C+D), $\overline{\text{D}}$, logic right shift C (LRS C) and logic left shift D (LLS D) are performed by arithmetic and logic cells 53, 55, 56, 59 and 60, respectively. Cell 54, in the present example, is not used to perform any function and is therefore not used (N.U.).

In order to implement the add function, three cells 53, 57 and 58 each operate to compute, respectively, the partial sum, carry status and partial carry for A plus B. The method of generating a sum from partial sum, carry status and partial carry is well known in the art of logic designs, and therefore will not be discussed in detail herein.

Referring to FIG. 5, a schematic diagram of function block 41 and cells 45–60 is shown. Memory cells 45–48 are shown having inverter logic gates 12 and 14 to simplify the already complex drawing figure. Each memory cell 45–48 has a node 62–65 where a positive logic level of the value stored therein may be obtained, and a second node 66–69 where an inverted logic level of the stored value may be obtained. Memory cells 45–48 will supply operand values to arithmetic and logic cells 49–60 of function block 41 or the current bit position, and also to cells of neighboring function blocks 42 and 43 (FIG. 4).

Arithmetic and logic cell 49 performs the inverse function of the value stored in memory cell 45. Cell 49 is selectable by having word line WLN and bit lines BIT4 and $\overline{\text{BIT4}}$ high. First and second pass transistors 72 and 73 are coupled to word line WLN and also to bit lines BIT4 and $\overline{\text{BIT4}}$, respectively. A MOS transistor 74 is further coupled to pass transistor 73 with its source coupled to the drain of transistor 73, and its drain coupled to ground. The gate of MOS transistor 74 is coupled to the drain of pass transistor 72. Also coupled to the drain of pass transistor 72 is the source of a MOS transistor 75 and the drain thereof is coupled to ground. The gate of transistor 75 is coupled to node 62 of memory cell 45.

Node 62 of memory cell 45 supplies an operand logic value to the gate of transistor 75. If the logic level of bit N of operand A is high, then transistor 75 is turned on to pass on the low logic level from ground to transistor 72 and then to bit line BIT4. Bit line $\overline{\text{BIT4}}$, on the other hand, is at a substantially higher logic level. Conversely, if the logic level at node 62 is low, transistor 75 remains off, bit line BIT4 is high and transistor 74 is switched on to pass a low logic level to bit line $\overline{\text{BIT4}}$. Implemented in this manner, the value stored in memory cell 45 is inverted and sensible on bit lines BIT4 or $\overline{\text{BIT4}}$.

Cells 51 and 56 also perform the inversion function and are structured like cell 49. Cell 51 obtains its operand C from node 64 of memory cell 47, and cell 56 obtains its operand D from node 65 of memory cell 48. The details of both cells 51 and 56 will not be discussed further herein. Note, however, that in cells 49, 51 and 56, transistor 75 constitutes pull down logic circuit 34 of the memory cell configuration shown in FIG. 3, and that no pull up logic circuit exists.

Arithmetic and logic cell 50 performs the AND function of two operands A and B stored in memory cells 45 and 46, respectively. Cell 50 is selectable by asserting appropriate voltage levels on word line WLN+1 and bit lines BIT4 and $\overline{BIT4}$ as known in the art. First and second pass transistors 77 and 78 are coupled respectively to bit lines BIT4 and $\overline{BIT4}$. A MOS transistor 79 is coupled to transistor 78, where the source of transistor 79 is connected to the drain of transistor 78, and the drain of transistor 79 is coupled to ground. The gate of transistor 79 is connected to the drain of transistor 77. Also coupled to the drain of transistor 77 are the sources of parallel-coupled MOS transistors 80 and 81, the drains of which are coupled to ground. The gate of transistor 80 is coupled to node 66 of memory cell 45. The gate of transistor 81 is coupled to node 67 of memory cell 46.

It is known in the art of Boolean logic that (A AND B) is equivalent to ($\overline{A}$ OR $\overline{B}$). A pull down logic circuit comprising transistors 80 and 81 accomplishes the foregoing logic function as follows: the gates of transistors 80 and 81 receive the inverse of the logic values stored in memory cells 45 and 46, which, for ease of illustration, is designated as $\overline{A}$ and $\overline{B}$. The parallel coupling of transistors 80 and 81 forms an OR function in which either or both transistors 80 and 81 will be switched on if the gate of either or both transistors 80 or 81 experience a high voltage level. The low logic level passed by either or both transistors 80 and 81 is then passed to bit line BIT4 by transistor 77.

Cell 52 implements the AND function of operands C and D stored respectively in memory cells 47 and 48. The structure and layout of cell 52 is preferably identical to cell 50.

Cell 55 implements the OR function of operands (C and D) or (C+D). First and second pass transistors 85 and 86 are coupled to word line WLN+2 and to bit lines BIT2 and $\overline{BIT2}$, respectively. The source of a MOS transistor 87 is coupled to the drain of pass transistor 85, in which its drain is coupled to ground and its gate is coupled to the drain of pass transistor 86. Two transistors 88 and 89 coupled in parallel are connected between ground and the gate of transistor 87. The gates of transistors 88 and 89 are coupled to node 64 of memory cell 47 and node 65 of memory cell 48, respectively.

Whenever the gate of transistor 88 and/or 89 is high from either operand being high, the low logic level is passed from ground through transistors 88 and/or 89 and through transistor 86. Bit line $\overline{BIT2}$ is then low. The same low logic level keeps transistor 87 turned off, which allows bit line BIT2 to float high. It is easily seen that if both operands C and D are low, bit line BIT2 becomes high and $\overline{BIT2}$ becomes low. Thus, the OR function is implemented in cell 55.

Cell 59 implements the logic right shift (LRS) function of operand C. Cell 59 includes pass transistors 95 and 96 coupled to word line WLN+2 and to respective bit lines BIT1 and $\overline{BIT1}$. A MOS transistor 97 is coupled between the drain of transistor 95 and ground, with its source connected to transistor 95, its drain to ground and its gate coupled to the drain of transistor 96. A second MOS transistor 98, constituting the pull down logic circuit, is coupled between the drain of transistor 96 and ground. The gate of transistor 98 is connected to node 64 of memory cell 47 of bit N+1.

Implemented in this manner, the logic value of C of bit N+1 is reflected in the logic level of bit line BIT1, which effectively shifts the bit logic values of C to the right by one place.

Cell 60, which implements logic left shift (LLS) of D, is structured similarly to cell 59. Pass transistors 100 and 101 are coupled to word line WLN+3 and respectively to bit lines BIT1 and $\overline{BIT1}$. The source of a MOS transistor 102 is coupled to pass transistor 100, the drain thereof to ground, and the gate is coupled to pass transistor 101. A MOS transistor 103 is further coupled to the pass transistor 101. Implemented in this manner, the logic level of bit N−1 of operand D is effectively shifted to the left by one place.

There is more than one way to implement the add function, and FIG. 5 merely shows one way in which the sum for A plus B is constructed from computed values for partial sum, partial carry and carry status. It is well known in the art how partial sum, carry and carry status may be generated with logic circuits.

Cell 53 computes the partial carry for A plus B and includes first and second pass transistors 105 and 106, which are coupled to word line WLN and respectively to bit lines BIT2 and $\overline{BIT2}$. The source of a transistor 107 is coupled to transistor 106, its drain is coupled to ground and its gate is coupled to transistor 105. A pull down logic circuit consisting of transistors 108 and 109 is further coupled to transistor 105. Transistors 108 and 109 are coupled in the following manner: the gate of transistor 108 is connected to the drain of transistor 109; the gate of transistor 109 is connected to the drain of transistor 108; and both sources are coupled to the drain of transistor 105. The drain of transistor 108 is further coupled to node 66 of memory cell 45, and the drain of transistor 109 is coupled to node 67 of memory cell 46. It is evident that transistors 108 and 109 implement the exclusive-OR function, where bit line $\overline{BIT2}$ is high only if one of the two inputs, A or B, is high.

Arithmetic and logic cell 58 generates the partial carry for the A plus B function. Cell 58 includes first and second pass transistors 115 and 116 coupled to word line WLN+1 and respectively to bit lines BIT1 and $\overline{BIT1}$. The source of a MOS transistor 117 is coupled to the drain of pass transistor 116, and the drain thereof is coupled to ground. A pull down logic circuit consisting of first and second transistors 118 and 119 is coupled to the gate of transistor 117, which is also coupled to the drain of transistor 115. Transistors 118 and 119 are coupled in parallel, with their sources coupled to transistor 117 and their drain coupled to ground. The gate of transistor 118 is coupled to a node of bit N−1 comparable to node 66. Similarly, the gate of transistor 119 is coupled to node 67 of bit N−1.

The pull down logic circuit in cell 58 in actuality implements the AND function, but the operands are from the function block of bit N−1. Whenever bits N−1 of A and B are both one, a carry is required for bit N. Therefore, cell 58 computes the partial carry of the add function.

Cell 57 is shown in FIGS. 4 and 5 to compute a carry status for the add function. The carry status indicates whether a carry is required in any bit position. In the present embodiment of the invention, this is accomplished by implementing the AND function. The cell includes pass transistors 110 and 111 coupled to word line WLN and respectively to bit lines BIT1 and $\overline{BIT1}$. The drain of transistor 111 is coupled to the source of a MOS transistor 112, the drain of which is coupled to ground, and the MOS transistor 112 gate is coupled to the drain of transistor 110. A pull down logic circuit consisting of a first transistor 113 coupled in series with a second transistor 114 is coupled between the drain of transistor 110 and ground. The drain of transistor 110 is further coupled to a CARRY STATUS line extending the length of the function blocks for each word.

If the gates of transistors 113 and 114 both experience a high logic level, the CARRY STATUS line is pulled low. Thus, whenever the logic levels for both operands A and B are high in any bit position, the CARRY STATUS line will be brought low, indicating a carry is required in at least one bit position.

In operation, a partial sum, carry and carry status is first generated for A plus B. If CARRY STATUS line indicates that a carry was necessary for any bit position, then the generated partial sum and partial carry are summed to produce another set of partial sum, partial carry and carry status. As long as the logic level on the CARRY STATUS line indicates a carry is required, the partial sum is added to the partial carry until there is no carry required at any bit position.

It is important to note that most logic and arithmetic functions may be implemented in a number of ways as known in the art. For example, the AND logic function may be implemented by MOS transistors connected in series, with each gate receiving non-inverted inputs, or by MOS transistors connected in parallel, with each gate receiving inverted inputs and the result inverted. Such various known methods of generating results are equally applicable to arithmetic functions. Therefore, although only certain implementations are shown herein, those known methods not shown are also anticipated by the present invention.

Because of the inherent compactness of memory devices, multiple ALUs thusly implemented according to the teachings of the present invention may reside on a single integrated circuit device in addition to space allotted for memory functions. Referring to FIG. 6, a portion 121 of a memory array may be designated for memory functions only, which reside alongside ALUs 122, 123 and 124. Memory portion 121 of the memory array and ALUs 122–124 may be accessible by exerting proper voltage levels on word lines 126–134 and bit lines 136–141. FIG. 6 provides an illustration of a possible layout and may contain a greater number of ALUs than shown in FIG. 6.

Implemented in the manner shown in FIG. 6, numerical and logic values may be stored in memory 121, read and then written to certain memory cells within ALUs 122–124, which are then accessed to serve as operands for arithmetic and logic functions to be performed. Using multiple ALUs 122–124, functions may be executed in parallel to achieve greater speed.

Although the present invention has been described in detail, it should be understood that various changes, substitutions and alterations can be made hereto without departing from the spirit and scope of the present invention as defined by the appended claims.

What is claimed is:

1. A static random access memory array comprising:
a plurality of memory cells each having a memory storage element, wherein each memory storage element is accessible via a word line and at least one bit line;
a plurality of arithmetic and logic circuits being fabricated in selected locations in said memory array in place of selected memory cells, whereby certain memory cells in said memory array are configured as an arithmetic or logic cell to perform arithmetic or logic functions respectively;
said arithmetic and logic circuits are coupled to selected memory cells for receiving bits of information relating to operand values, upon which an arithmetic or logic operation will be performed;
said arithmetic and logic circuits and memory cells being fabricated in a single integrated circuit; and
wherein said arithmetic and logic circuits comprise:
a first and a second pass transistor;
a third transistor; and
pull down logic circuitry;
said first and second pass transistors each has its gate coupled to a word line, said first pass transistor further has its source coupled to a bit line and its drain coupled to the source of said third transistor, said third transistor further has its drain coupled to ground and its gate is coupled to a common node, said second pass transistor is coupled between an inverted bit line and said common node;
said pull down logic circuitry is coupled between said common node and a ground voltage and is comprised of n channel MOS devices which only sink current and said pull down logic circuitry is coupled to at least one selected memory cell for receiving at least one bit of information relating to operand values upon which arithmetic or logic operations are to be performed in the pull down logic circuitry.

2. A static random access memory array comprising:
a plurality of memory cells each having a memory storage element, wherein each memory storage element is accessible via a word line and at least one bit line;
a plurality of arithmetic and logic circuits being fabricated in selected locations in said memory array in place of selected memory cells, whereby certain memory cells in said memory array are configured as an arithmetic or logic cell to perform arithmetic or logic functions respectively;
said arithmetic and logic circuits are coupled to selected memory cells for receiving bits of information relating to operand values, upon which an arithmetic or logic operation will be performed;
said arithmetic and logic circuits and memory cells being fabricated in a single integrated circuit; and
wherein said arithmetic and logic circuits comprise:
a first and a second pass transistor;
a third transistor; and
pull down logic circuitry;
said first and second pass transistors each has its gate coupled to a word line, said second pass transistor further has its source coupled to an inverted bit line and its drain coupled to the source of said third transistor, said third transistor further has its drain coupled to ground and its gate is coupled to a common node, said first pass transistor is coupled between a bit line and said common node;
said pull down logic circuitry performs inverted logic and is coupled between said common node and a ground voltage and is comprised of n channel MOS devices which only sink current and said pull down logic circuitry is coupled to at least one selected memory cell for receiving at least one bit of information relating to operand values upon which arithmetic or logic operations are to be performed in the pull down logic circuitry.

3. The static random access memory array of claim 1, wherein said pull down logic circuitry is configured to implement arithmetic and logic functions such as add, subtract, multiply, divide, inverse, AND, OR, exclusive-OR, logic right shift and logic left shift.

4. The static random access memory array of claim 2, wherein said pull down logic circuitry is configured to implement arithmetic and logic functions such as add, subtract, multiply, divide, inverse, AND, OR, exclusive-OR, logic right shift and logic left shift.

* * * * *